United States Patent [19]

Kawano et al.

[11] Patent Number: 4,908,582
[45] Date of Patent: Mar. 13, 1990

[54] AFC CIRCUIT FOR PRODUCING A RIPPLE-FREE OSCILLATOR CONTROL VOLTAGE

[75] Inventors: Mitsumo Kawano, Kumagaya; Tadashi Terada, Fukaya, both of Japan

[73] Assignee: Kabushiki Kaisha Toshiba, Kawasaki, Japan

[21] Appl. No.: 330,292

[22] Filed: Mar. 29, 1989

[30] Foreign Application Priority Data

Mar. 31, 1988 [JP] Japan .................................. 63-78764

[51] Int. Cl.⁴ ............................................. H03L 7/08
[52] U.S. Cl. ...................................... 331/1 A; 331/14; 331/17; 331/20; 331/27; 358/158; 328/134; 328/155
[58] Field of Search ...................... 331/1 A, 11, 12, 14, 331/17, 27, 20; 358/158, 159; 328/155, 133, 134

[56] References Cited

U.S. PATENT DOCUMENTS 3,824,483  7/1974  Margala et al. ..................... 331/1 A
4,520,394  5/1985  Kaneko ............................... 358/150
4,613,827  9/1986  Takamori et al. ..................... 331/20

OTHER PUBLICATIONS

Yuuichi Kawakami, "Phase Synchronous Oscillating Circuit", Patent Abstracts of Japan, Aug. 1981, vol. 5, No. 125 (Japanese Patent No. 56-61833, 5-27-81).

Primary Examiner—Siegfried H. Grimm
Attorney, Agent, or Firm—Cushman, Darby & Cushman

[57] ABSTRACT

An AFC circuit using counters, flip-flops and logic gates produces a first pulse signal only when the phase of a VCO output signal lags the phase of a reference signal, and produces a second pulse signal only when the phase of the VCO output signal leads the phase of the reference signal. The first and second pulse signals control a switch to connect a first or a second constant current source to charge or discharge a filter circuit, to thereby produce a control voltage for the VCO. When the VCO output signal is in phase with the reference signal, the switch remains in a neutral position to hold a constant control voltage on the filter.

20 Claims, 4 Drawing Sheets

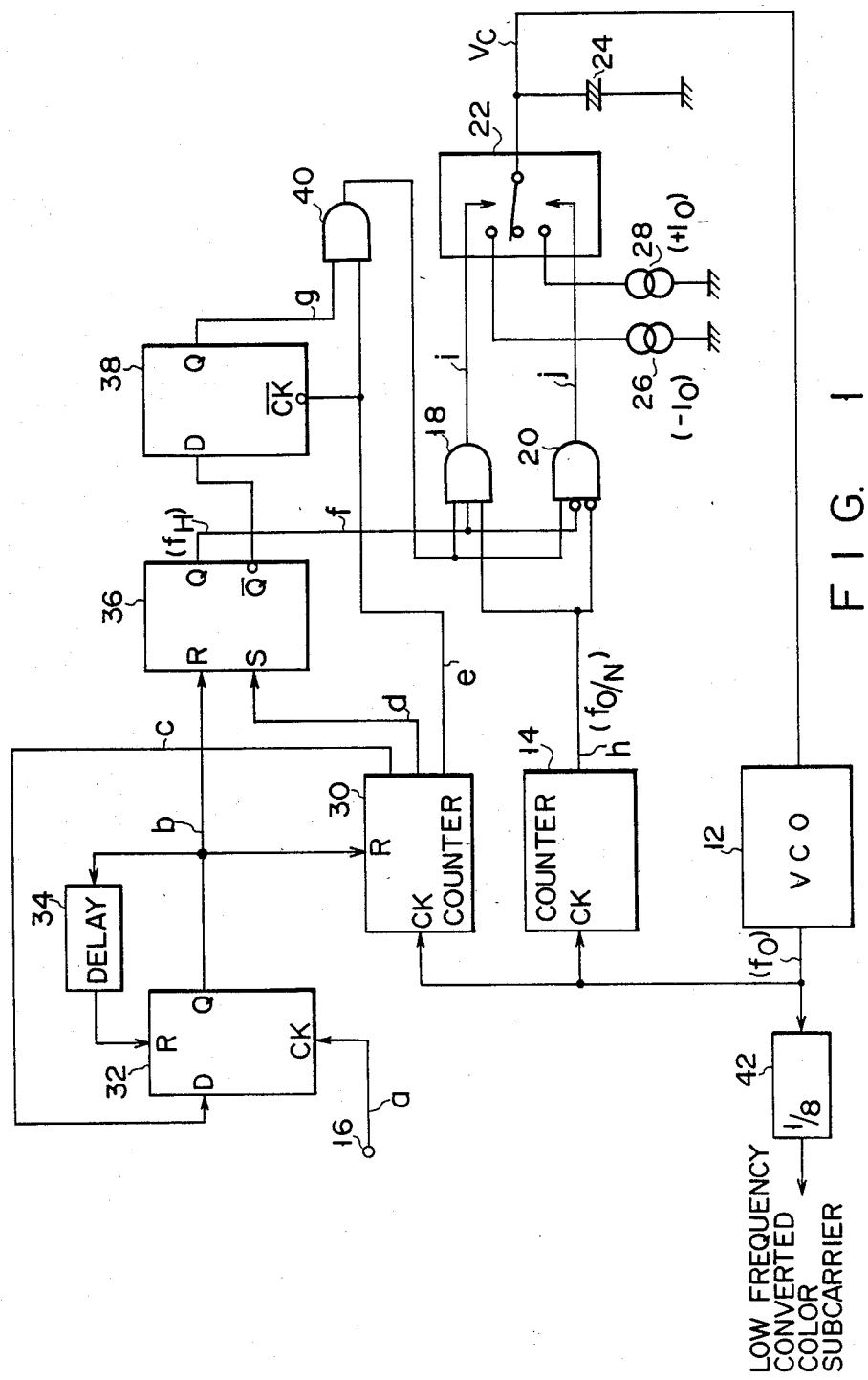
F I G. 1

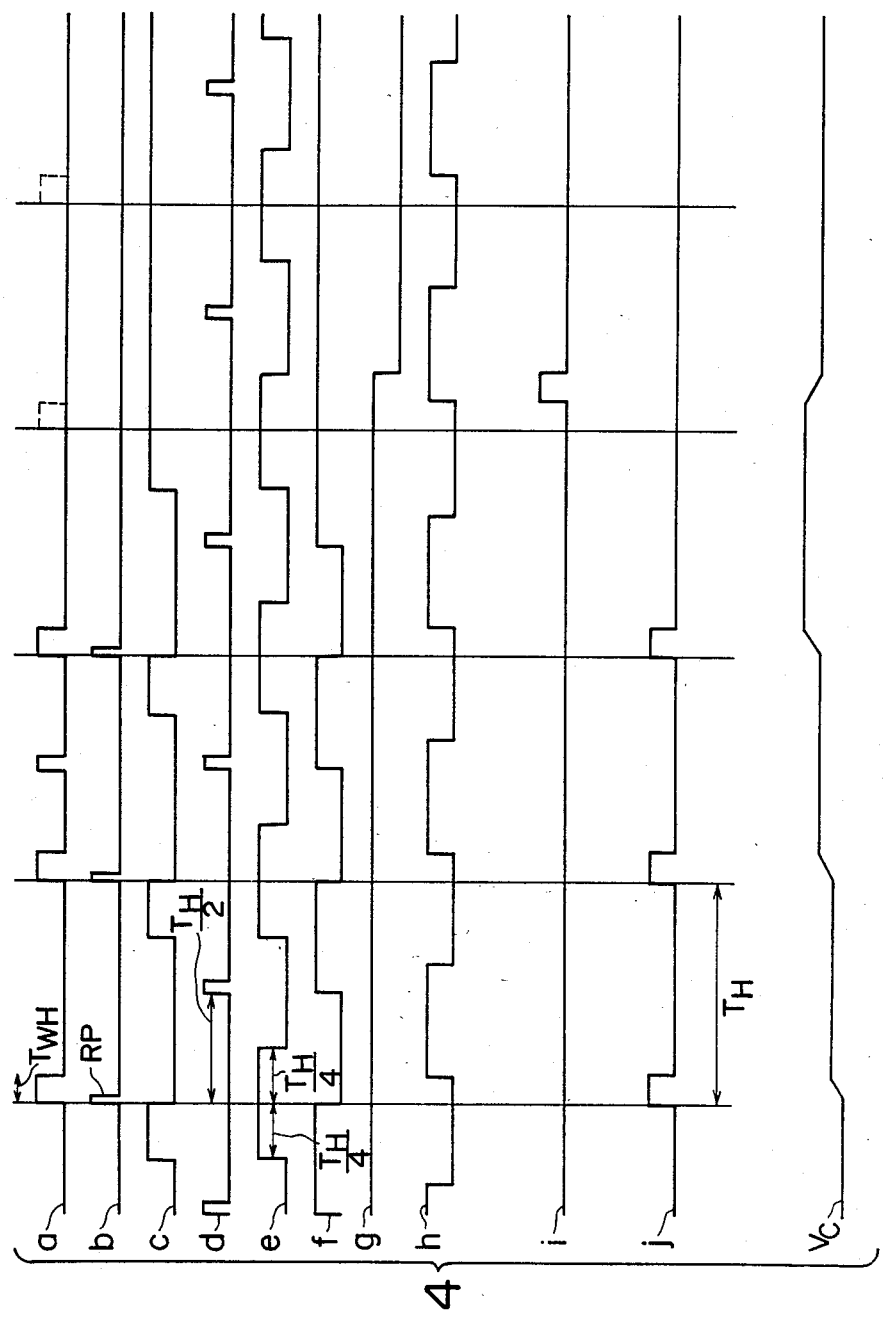

AFC CIRCUIT FOR PRODUCING A RIPPLE-FREE OSCILLATOR CONTROL VOLTAGE

BACKGROUND OF THE INVENTION

1. Field of the Invention

The present invention relates to an automatic frequency control (AFC) circuit suitable for obtaining a low-frequency converted color subcarrier signal phase locked at a horizontal sync signal of a television signal of a video tape recorder (VTR), for example.

2. Description of the Related Art

In general VTRs, a color subcarrier signal is converted into a signal of low frequency before its recording. An AFC circuit is used for obtaining a color subcarrier signal exactly synchronized with a horizontal sync signal of a television signal. The AFC circuit includes an AFC loop functioning as below. A horizontal sync signal at a frequency $f_H$ of a television signal is phase compared with a signal that is a signal whose frequency is $1/N$ of a frequency ($f_0$) of an output signal of a voltage controlled oscillator (VCO), where N is a positive integer. The oscillation of the VCO is controlled on the basis of the result of the phase comparison so that $f_0 = Nf_H$.

The AFC circuit may be configured by a digital technology as below. It comprises: a sync separation circuit for separating a horizontal sync signal from a composite sync signal supplied to an input terminal; a phase comparator for phase comparing the horizontal sync signal derived from the sync separation circuit with a pulse signal output from the VCO through a logical operation of the horizontal sync signal and the pulse signal; a switch circuit whose connection state is switched in accordance with the result of the phase comparison; a filter whose charge/discharge is controlled by a connection state of the switch circuit; a first constant current source outputting a charging current $+I_0$ for the filter; a second constant current source for feeding a discharge current $-I_0$ to the filter; the VCO whose oscillating frequency $f_0$ is controlled by a voltage across the filter; and a counter for demutiplying a frequency of the output signal of the VCO into a $1/N$ frequency and supplying it to the phase comparator. The phase comparator has a first AND gate for logically summing the horizontal sync signal derived from the sync separation circuit with the frequency demultiplied signal derived from the counter, and a second AND gate for logically summing the horizontal sync signal derived from the sync separation circuit with a signal that is an inverse of the frequency demultiplied signal derived from the counter.

In the AFC circuit thus configured, the counter demultiplies the frequency of the output pulse signal of the VCO into a frequency of a factor of N, to form a pulse signal of the same frequency as that of the horizontal sync signal. The output signal of the first AND gate, which logically multiplies the frequency demultiplied pulse signal and the horizontal sync signal from the sync separator, is of a nature such that its pulse width becomes wider, the more the phase of the output signal of the counter advances, and it becomes narrower, the more that phase lags. The output signal of the second AND gate has a reverse nature to that of the first AND gate, that is, its pulse width becomes narrower, as the phase of the counter output signal advances, and it becomes wider, as that phase lags.

The output signals of the first and second AND gates control the switch circuit for the charge/discharge and hold operations of the filter. More specifically, when the output signal of the first AND gate has a high logic level, the switch circuit connects the second constant current source to the filter, to allow a discharge of the filter. The result is a decrease in control voltage for the VCO. When the output signal of the second AND gate has a high logic level, the switch circuit connects the first constant current source to the filter, to allow charging of the filter. The result is an increase of the control voltage for the VCO. When the output signals of the first and second AND gates are both low, the switch circuit is in a neutral state, so that the control voltage is held.

In other words, when the trailing edge of the counter output signal is located at the center of the pulse duration of the horizontal sync signal, the pulse width of the output signal of the first AND gate is equal to that of the output signal of the second AND gate. The result is that the charge and discharge times are equal to each other, and the voltages across them are also equal to each other. Under this condition, an oscillating frequency $f_0$ of the VCO is locked at frequency $Nf_H$. A subsequent frequency demultiplication of the oscillating signal into a ½ frequency produces a low frequency converted color subcarrier signal synchronized with the horizontal sync signal.

The AFC circuit thus arranged changes the ratio of the charge and discharge times of the filter for the pull-in operation. Therefore, even in a locked state of the AFC, a ripple component appears in the control voltage during a phase detect period (charge and discharge periods). More exactly, the AFC is locked so that $f_0 = Nf_H$ is satisfied, where $f_0$ is an oscillating frequency of the VCO for an average value of the control voltage. For the instantaneous control voltage, the oscillating frequency $f_0$ of the VCO is not always equal to $Nf_H$. When the relationship $f_0 = Nf_H$ is not satisfied, a frequency in the vicinity of the burst of the video signal component deviates significantly, leading to a major deviation of hue.

If the filter values are set to appropriate values, the control voltage may be constant in the video signal component, but the relation $f_0 = Nf_H$ cannot be satisfied.

As just mentioned, in the conventional AFC circuit, the control voltage for the VCO contains a ripple component even in the locked state of the AFC. The VCO oscillates so as to satisfy $f_0 = Nf_H$ for the average value of the control voltage. However, this relation does not hold for the instantaneous value. The inequality of those frequencies leads to a great color irregularity. This problem requires an urgent solution.

SUMMARY OF THE INVENTION

An object of the present invention is to provide an automatic frequency control circuit which produces a VCO oscillating signal of a stable frequency, while removing the ripple component of the control voltage for the VCO.

To achieve the above object, there is provided an automatic frequency control (AFC) circuit comprising input terminal means for receiving a reference pulse signal recurring at predetermined cycles, voltage controlled oscillating means for outputting an oscillating output pulse signal, frequency demultiplying means for demultiplying a frequency of the oscillating output pulse signal, output from the voltage controlled oscillating means, to produce a first pulse signal of the same period as that of the reference pulse signal received at the input terminal means, pulse generating means for counting the oscillating output pulse signal from the voltage controlled oscillating means in synchronism with the reference pulse signal, to output thereby a second pulse signal of substantially the same pulse width as that of the first pulse signal, output from the frequency demultiplying means, first multiplying means for multiplying the first and second pulse signals during a predetermined period in synchronism with the reference pulse signal, to produce thereby a third pulse signal of a pulse width based on a phase difference between the first and second pulse signals, only when the first pulse signal advances in phase with respect to the second pulse signal, second multiplying means for multiplying the first and second pulse signals during the predetermined period in synchronism with the reference pulse signal, to produce thereby a fourth pulse signal of a pulse width based on a phase difference between the first and second pulse signals, only when the first pulse signal lags in phase with respect to the second pulse signal, and frequency control means for generating a control voltage based on the pulse width of either of the third and fourth pulses, and supplying the control voltage to the voltage controlled oscillating means, to control thereby an oscillating frequency of the voltage controlled oscillating means so as to phase lock the oscillating output pulse signal at the reference pulse signal.

With such an arrangement, in a locked state of the AFC circuit, an edge of the frequency demultiplied signal coincides with that of the pulse signal synchronized with the reference pulse signal, and neither of the third and forth pulse signals presenting a phase difference is produced. Accordingly, in this state, the control voltage to the VCO contains no ripple, and an oscillating pulse signal has a frequency that is stable as a whole.

BRIEF DESCRIPTION OF THE DRAWINGS

FIG. 1 is a block diagram showing a configuration of an embodiment of an automatic frequency control circuit according to the present invention;

FIG. 4 shows waveforms of signals at respective key points in the circuit of FIG. 1 when the phase of an output signal of the counter 14 in FIG. 1 lags.

DETAILED DESCRIPTION OF THE PREFERRED EMBODIMENT

Figure 2:
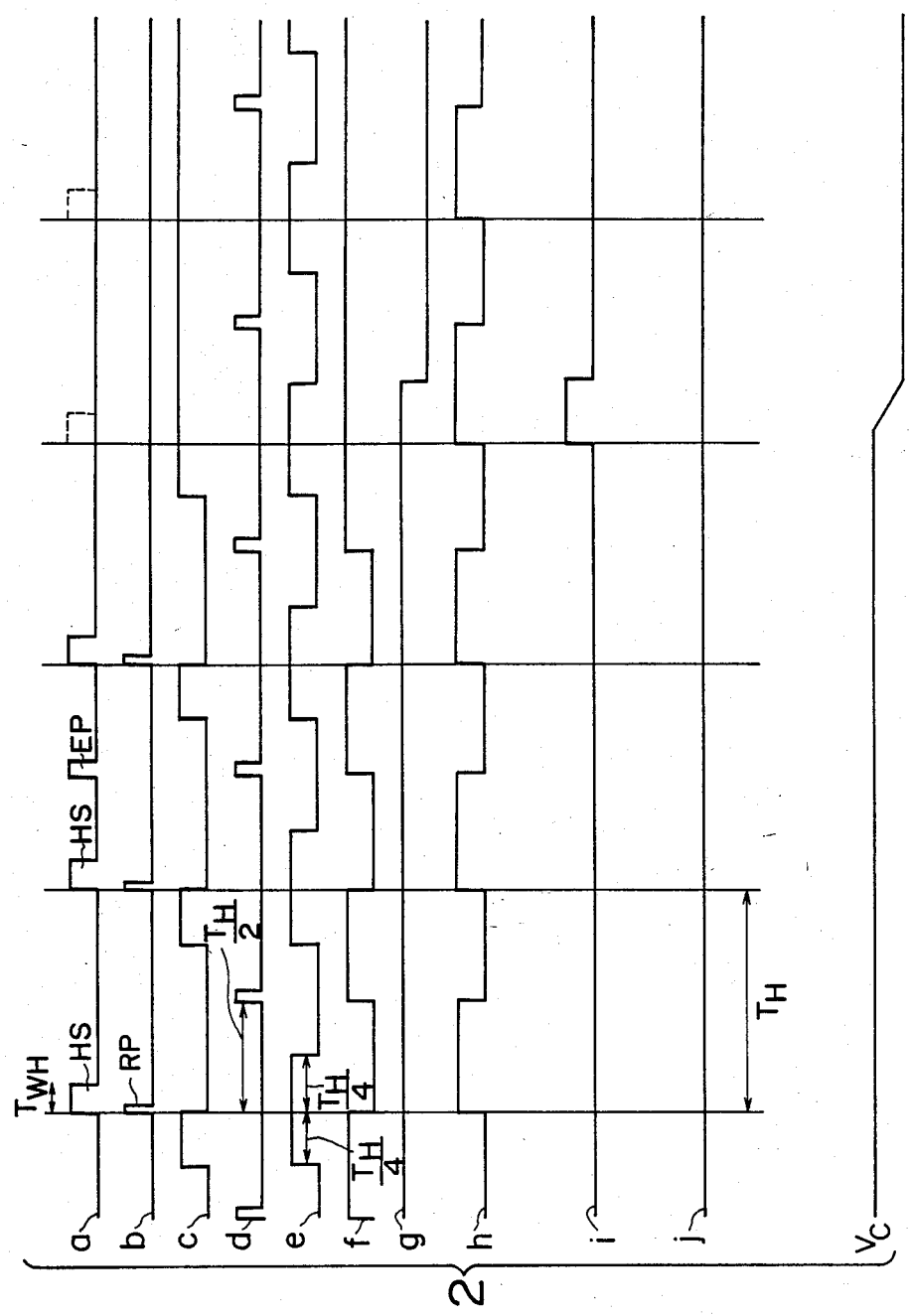
FIG. 2 shows waveforms of signals at respective key points in the circuit of FIG. 1.

Before proceeding with a description of a preferred embodiment of the present invention, it must explicitly be understood that in an automatic frequency control circuit (AFC) to be described as an embodiment of the present invention, only one of the charge and discharge operations is performed when a phase shift exists, and neither of them is performed when the AFC circuit is locked. Further, the AFC circuit contains a circuit for removing an equalizing pulse from a composite sync signal, and a circuit for detecting absence of a horizontal sync signal to inhibit a phase comparison.

A preferred embodiment of the present invention will be described in detail with reference to the accompanying drawings.

FIG. 1 shows a configuration of an AFC circuit according to the present invention. In the circuit, a pulse signal of frequency $f_0$ output from a voltage controlled oscillator (VCO) 12 is input to a clock input terminal CK of a first counter 14. The first counter 14 demultiplies the frequency of the output pulse signal of the VCO 12 into a 1/N frequency, and produces a pulse signal of the same frequency as that of a horizontal sync signal of a composite sync signal. The output pulse signal of the first counter 14 is supplied to a first AND gate 18 and is inverted and applied to a second AND gate 20. For phase comparison, each of the first and second AND gates 18 and 20 logically sums the output pulse signal from the first counter 14 and a pulse signal which is in synchronism with a horizontal sync signal which is formed, in a manner which will be explained later, from the horizontal sync signal of the composite sync signal supplied to the input terminal 16.

The output signals of those gates 18 and 20 are applied to a switch circuit 22, as control signals for controlling a connection of the switch circuit 22. The switch circuit 22 connects a filter 24 to any of a first constant current source 26, neutral, and a second constant current source 28. When the logic level of an output signal of the first AND gate 18 is high, the switch circuit 22 connects the filter 24 to the first constant current source 26, which feeds a current $-I_0$ for filter discharging. When the logic levels of an output signal of the second AND gate 20 is high, the switch circuit 22 connects the filter 24 to the second constant current source 28, which feeds a current $+I_0$ for filter charging. When the logic levels of those gates are low, the switch circuit 22 is in a neutral position so that the filter 24 retains its potential as is. The voltage across the filter 24 is applied as a control voltage $V_C$ to the VCO 12.

An output pulse signal of the VCO 12 is applied to a clock input terminal CK of a second counter 30 with three output terminals. A first output pulse signal of the second counter 30 is applied to a data input terminal D of a first D flip-flop 32 whose clock input terminal CK is coupled with the composite sync signal from the input terminal 16. An output pulse signal derived from an output terminal Q of the first D flip-flop 32 is applied to a reset terminal R of the first D flip-flop 32 via a delay circuit 34, and also to a reset terminal R of the counter 30.

The output pulse signal from the output terminal Q of the first D flip-flop 32 is also applied to a reset terminal R of an RS flip-flop 36. The RS flip-flop 36 receives at the set terminal S a second output pulse of the second counter 30, which is to be given later. The output pulse from the output terminal Q of the RS flip-flop 36 is input to the first AND gate 18, and is inverted and applied to the second AND gate 20. The output pulse from the output terminal $\overline{Q}$ of the RS flip-flop 36 is supplied to the data input terminal D of a second D flip-flop 38 whose clock input terminal $\overline{CK}$ is coupled with a third output pulse signal of the second counter 30, to be given later. The output pulse from the output terminal Q of the second D flip-flop 38 is supplied to a third AND gate 40 which in turns logically operates the received signal and the third pulse signal of the second counter 30. The output pulse of the third AND gate 40 is supplied to the first and second AND gates 18 and 20.

The pulse signal from the VCO 12 in the AFC circuit is supplied to a frequency demultiplying circuit 42. The circuit 42 demultiplies the frequency of the output pulse signal of the VCO 12 into a ⅓ frequency. In this way, a low frequency converted color subcarrier signal synchronized with the horizontal sync signal is formed.

The operation of the AFC circuit thus arranged will be described with reference to the timing charts of FIGS. 2 to 4.

As shown in FIG. 2, a composite sync signal "a" supplied to the input terminal 16 contains a horizontal sync signal HS at cycles $T_H$ and an equalizing pulse EP. Removal of the equalizing pulse EP is required for avoiding an erroneous AFC operation. During a fixed period (in this instance, approximately $(¾)T_H$) after the inputting of the horizontal sync signal HS, the level of a first output signal "c" from the counter 30 is lowered. The counter 30 uses the output pulse signal of the VCO 12 for a count clock signal. A composite sync signal "a" is masked. This is done to inhibit the level of the output pulse signal "b" from the output terminal Q of the first D flip-flop 32 from going high. Therefore, the first D flip-flop 32 produces only a trigger pulse signal "b" containing a reset pulse RP synchronized with the horizontal sync signal HS. The reset pulse RP resets the second counter 30. At the leading edge of the horizontal sync signal, the second counter 30 counts 0, then subsequently counts the oscillating output signal of the VCO 12.

The second counter 30 is so arranged that when it is not reset by the reset pulse RP, it executes substantially the same frequency demultiplying operation as that of the first counter 14. A second output signal "d" of the second counter 30 is a trigger pulse signal produced when it counts the oscillation output pulse signal by N/2 after the second counter 30 is reset by the reset pulse RP, that is, when approximately $(½)T_H$ elapses after the leading edge of the horizontal sync signal HS. A third output signal "e" of the second counter 30 is a pulse signal, the level of which is lowered during a period from the instant that the second counter 30 counts the oscillation output pulse signal by about N/4 after the second counter 30 is reset by the reset pulse RP till it counts the oscillation output pulse signal by about (¾)N, that is, during a period from an instant that about $(¼)T_H$ elapses from the leading edge of the horizontal sync signal till about $(¾)T_H$ elapses. With the third output signal "e" thus set, when the VCO 12 oscillates in the vicinity of $f_0=Nf_H$, the third output signal "e" is at a high level during a period that extends (¼($T_H$ before and after the leading edge of the horizontal sync signal HS.

The RS flip-flop 36 is set by the second output signal "d" of the second counter 30, and is reset by the reset pulse RP in the output signal "b" of the first D flip-flop 32. The output signal "f" from the output terminal Q of the RS flip-flop 36 rises at the leading edge of the horizontal sync signal, and has a pulse width equal to that of the output signal "h" of the first counter 14.

The output signal from the output terminal $\overline{Q}$ of the RS flip-flop 36 is supplied to the data input terminal D of the second D flip-flop 38. The clock input terminal $\overline{CK}$ of the second D flip-flop 38 is coupled for reception with the third output signal "e" of the counter 30. The level of the output signal "g" of the output terminal Q of the second D flip-flop 38 is normally high.

The first counter 14 demultiplies the frequency of the oscillation output pulse signal of the VCO 12 into a 1/N frequency, for example, 1/320 frequency. The output signal "h" of the first counter 14, and the above signals "e", "f", and "g" are logically operated by the AND gates 18, 20, and 40, to compare the phases of the horizontal sync signal HS and the oscillation output pulse signal of the VCO 12. The output signal "i" of the first AND gate 18 is expressed by a logical sum (f.h.e.g). The output signal "j" of the second AND gate 20 is expressed by a logical sum (f h.e.g). In other words, the signal "i" presents a detection of the high level of the signals "f" and "h". The output signal "j" presents a detection of the low level of the same signals. The output signal "e" is used as a gate pulse to check a period that extends (¼)$T_H$ before and after the leading edge of the horizontal sync signal HS.

When a phase of the output signal "h" of the first counter 14 is as shown in FIG. 2, the signals "i" and "j" are both low. Further, the switch circuit 22 is in a neutral position, and the filter 24 is in a hold state. Consequently, the control voltage $V_C$ of the VCO 12 is constant. Under this condition, the AFC circuit is locked and an oscillation frequency $f_0$ of the VCO 12 satisfies the relation $f_0=Nf_H$.

Figure 3:
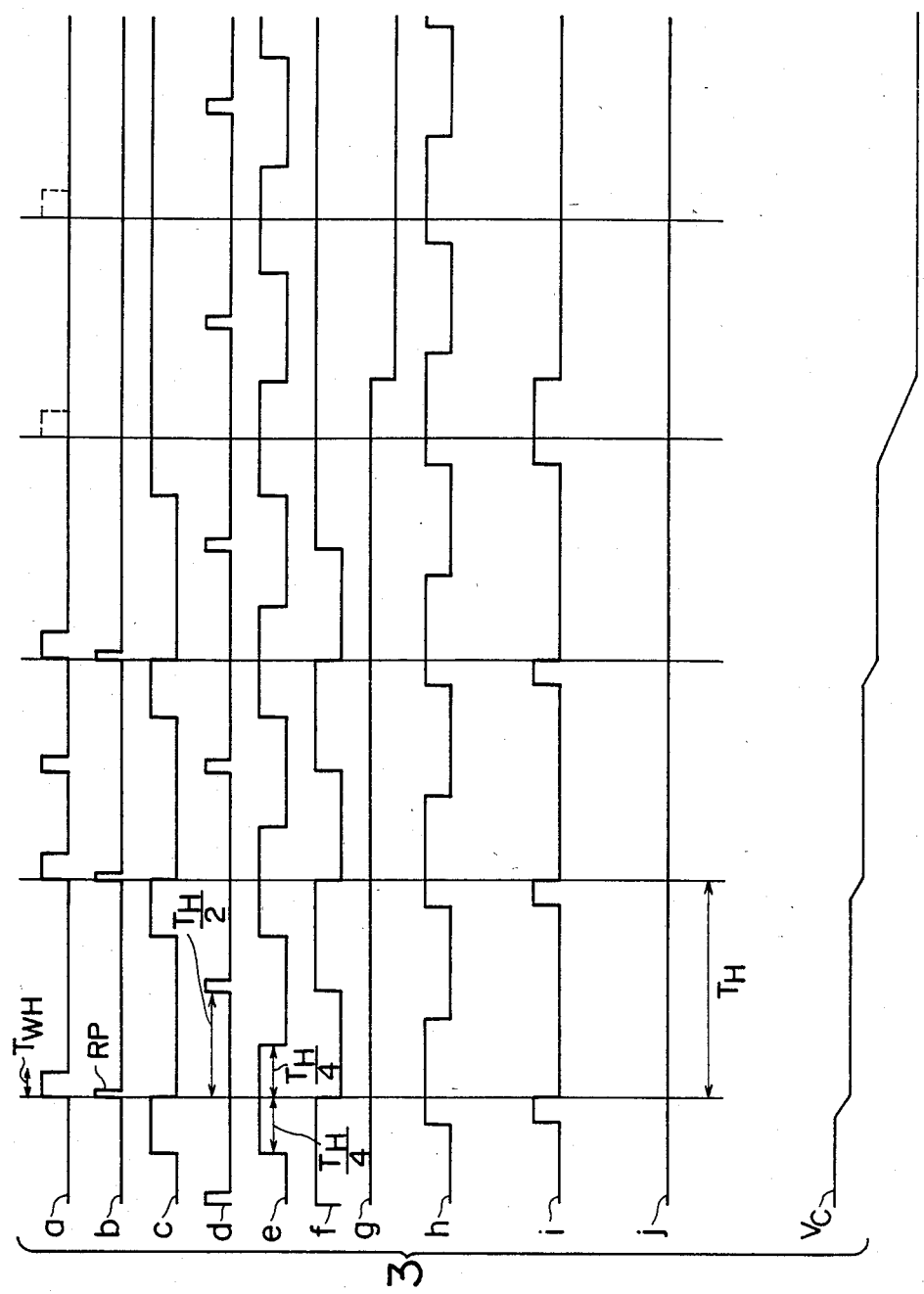
FIG. 3 shows waveforms of signals at respective key points in the circuit of FIG. 1 when an output signal of a counter 14 in FIG. 1 advances in phase.

The timing chart shown in FIG. 3 describes an operation state of the AFC circuit when the oscillation of the VCO 12 is disturbed, and the phase of the output signal "h" of the first counter 14 advances. In this case, the output signal "i" of the first AND gate 18 is temporarily high as shown. When the output signal "i" is high, the switch circuit 22 connects the first constant current source 26 to the filter 24 to discharge the filter. As a result, the control voltage VC of the VCO 12 is lowered, as shown.

The timing chart of FIG. 4 shows an operation state of the AFC circuit when the output signal "h" of the first counter 14 lags in phase. In this case, the output signal "j" of the second AND gate 20 temporarily goes high as shown. In the high level state of the output signal "j" of the second AND gate 20, the switch circuit 22 connects the second constant current source 28 to the filter 24, to charge the filter. The result is that the control voltage VC is pulled up as shown.

When the phase of the output signal "h" of the first counter 14 advances or lags, the AFC loop operates such that the control voltage VC controls the oscillating frequency $f_O$ of the output signal of the VCO 12 so that the phase of the output signal "h" of the first counter 14 approaches a position (leading edge of the horizontal sync signal) shown in FIG. 2.

As seen from FIGS. 2 to 4, the control voltage $V_C$ of the VCO 12 is constant till the next horizontal sync signal HS arrives, and hence the oscillating frequency $f_0$ of the VCO 12 is also kept constant. Therefore, when the AFC circuit is locked, the oscillating frequency $f_0$ of the VCO 12 satisfies $f_0=Nf_H$. The frequency of the low frequency converted color subcarrier signal resulting from demultiplying the frequency of the VCO oscillation output signal into a ⅓ frequency, is also kept at (⅓)$Nf_H$.

The operation of the AFC circuit when the horizontal sync signal HS is lost for some reason, will be described.

When a horizontal sync signal indicated by a broken line in FIGS. 2 to 4 is lost in the composite sync signal "a", the reset pulse RP formed from the horizontal sync signal is also lost, failing to reset the RS flip-flop 36. The output signal "f" derived from the output terminal Q of the RS flip-flop 36 continues a high level state till the next horizontal sync signal arrives. The output signal "g" derived from the output terminal Q of the second D flip-flop 38, which receives the output signal "e" of the second counter 30 as a clock signal, goes low at the trailing edge of the output signal "e", and continues a low level state till the output signal "f" goes low. During this period, the output signal "i" of the first AND circuit 18 is high during the first $(\frac{1}{4})T_H$ lack of the horizontal sync signal, and subsequently both the output signals "i" and "j" of the first and second AND gates 18 and 20 go low in level, so that no phase comparison is performed. This places the control voltage $V_C$ of the VCO 12 in a hold state.

The FIG. 1 circuit is so arranged that when the horizontal sync signal is lost, no detected output signal is produced. This arrangement prevents the VCO oscillation frequency $f_O$ from greatly deviating from a predetermined frequency.

As described above, the AFC circuit according to the present invention forms the pulse signal "f" which has substantially the same pulse width as that of the signal "h", output from the first counter 14, and is synchronized with the horizontal sync signal HS. To this end, it uses the second counter 30 and the RS flip-flop 36. The pulse signal "f" and the output signals "h" are multiplied by the first and second AND gates 18 and 20 during a predetermined period as defined by the pulse signal "e". The multiplication provides the pulse signal "i" of a pulse width indicating a phase advance of the pulse signal "h" with respect to the signal "f", and the pulse signal "j" of a width indicating a phase delay of the same. These signals are used for controlling the oscillating frequency $f_0$ of the VCO 12.

With such an arrangement of the AFC circuit, when the pulse signal "h" advances in phase with respect to the pulse signal "f", the pulse signal "i" alone is produced. In the reverse case, the pulse signal "j" alone is produced. When these signals "f" and "h" are in phase, neither of them is produced. Accordingly, in a locked state of the AFC circuit, no ripple component is contained in the control voltage $V_C$ of the VCO 12, and no deviation of hue occurs.

In the embodiment as mentioned above, when no horizontal sync signal is present, the multiplying operation for the phase comparison is inhibited. Therefore, in such a situation, the oscillating frequency of the VCO 12 is prevented from greatly deviating from a predetermined frequency.

It is evident that the present invention is applicable for circuits other than the AFC circuit for obtaining a low frequency converted color subcarrier signal synchronized with the horizontal sync signal.

It should be understood that the present invention is not limited to the above specific embodiment, but may be variously changed and modified within the scope and spirit as set forth in the appended claims.

As described above, the present invention successfully removes the ripple component which causes color irregularity from the control voltage for the VCO in a locked state of the AFC circuit. A low frequency converted color subcarrier signal obtained by the AFC circuit according to the present invention has a stable and exact frequency.

What is claimed is:

1. An automatic frequency control (AFC) circuit comprising:
    input terminal means for receiving a reference pulse signal recurring at predetermined cycles;
    voltage controlled oscillating means for outputting an oscillating output pulse signal;
    frequency demultiplying means for demultiplying a frequency of the oscillating output pulse signal, output from said voltage controlled oscillating means, to produce a first pulse signal of the same period as that of said reference pulse signal received at said input terminal means;
    pulse generating means for counting said oscillating output pulse signal from said voltage controlled oscillating means in synchronism with said reference pulse signal, to output thereby a second pulse signal of substantially the same pulse width as that of said first pulse signal, output from said frequency demultiplying means;
    first multiplying means for multiplying said first and second pulse signals during a predetermined period in synchronism with said reference pulse signal, to produce thereby a third pulse signal of a pulse width based on a phase difference between said first and second pulse signals, only when said first pulse signal advance in phase with respect to said second pulse signal;
    second multiplying means for multiplying said first and second pulse signals during said predetermined period in synchronism with said reference pulse signal, to produce thereby a fourth pulse signal of a pulse width based on a phase difference between said first and second pulse signals, only when said first pulse signal lags in phase with respect to said second pulse signal; and
    frequency control means for generating a control voltage based on the pulse width of either of said third and fourth pulses, and supplying said control voltage to said voltage controlled oscillating means, to control thereby an oscillating frequency of said voltage controlled oscillating means so as to phase lock said oscillating output pulse signal with said reference pulse signal.

2. The AFC circuit according to claim 1, wherein said pulse generating means includes:
    counter means, which is reset by said reference pulse signal received at said input terminal means, for counting said oscillation output pulse signal, output from said voltage controlled oscillating means, to produce thereby a fifth pulse signal at a predetermined timing; and
    RS flip-flop means, which is reset by said reference pulse signal received at said input terminal means, and set by said fifth pulse signal outputted from said counter means, for producing said second pulse signal.

3. The AFC circuit according to claim 2, wherein said counter means is reset by said reference pulse signal, and then produces said fifth pulse signal at said predetermined timing corresponding to about half of said predetermined cycle.

4. The AFC circuit according to claim 2, wherein said counter means produces a sixth pulse signal having a pulse width corresponding to about ¼ of said predetermined cycle after said counter means is reset by said reference pulse signal, and a pulse width corresponding to about ¼ of said predetermined cycle elapsing from a timing corresponding to about ¾ of said predetermined cycle after said counter means is reset by said reference pulse signal, and
    said first multiplying means includes first AND circuit means for logically operating said first pulse signal output from said frequency demultiplying means, said second pulse signal output from said RS flip-flop means, and said sixth pulse signal from said counter means, to produce thereby said third pulse signal, said sixth pulse signal being used as a signal defining said predetermined period.

5. The AFC circuit according to claim 4, wherein said second multiplying means includes second AND circuit means for logically operating an inverted signal of said first pulse signal output from said frequency demultiplying means, an inverted signal of said second pulse signal output from said RS flip-flop means, and said sixth pulse signal from said counter means, to produce thereby said fourth pulse signal.

6. The AFC circuit according to claim 5, wherein said frequency control means includes:
 filter means for holding said control voltage;
 first power source means for discharging said filter means;
 second power source means for charging said filter means; and
 switch means for selectively connecting said filter means to said first and second power source means in accordance with said third and fourth pulse signals output from said first and second AND circuit means, said switch means being connected to neither of said power source means when said third and fourth pulse signals are not supplied.

7. The AFC circuit according to claim 1, further comprising holding means for causing said frequency control means to hold said control voltage when said input terminal means does not receive said reference pulse signal when the timing of said predetermined cycle is reached.

8. The AFC circuit according to claim 7, wherein said pulse generating means includes:
 counter means, which is reset by said reference pulse signal received at said input terminal means, for counting said oscillation output pulse signal, output from said voltage controlled oscillating means, to produce thereby a fifth pulse signal at a predetermined timing; and
 RS flip-flop means, which is reset by said reference pulse signal received at said input terminal means, and set by said fifth pulse signal outputted from said counter means, for producing said second pulse signal.

9. The AFC circuit according to claim 8, wherein said counter means is reset by said reference pulse signal, and then produces said fifth pulse signal at said predetermined timing corresponding to about half of said predetermined cycle.

10. The AFC circuit according to claim 9, wherein said counter means produces a sixth pulse signal having a pulse width corresponding to about ¼ of said predetermined cycle after said counter means is reset by said reference pulse signal, and a pulse width corresponding to about ¼ of said predetermined cycle elapsing from a timing corresponding to about ¾ of said predetermined cycle after said counter means is reset by said reference pulse signal, and
 said first multiplying means includes first AND circuit means for logically operating said first pulse signal output from said frequency demultiplying means, said second pulse signal output from said RS flip-flop means, and said sixth pulse signal from said counter means, to produce thereby said third pulse signal, said sixth pulse signal being used as a signal defining said predetermined period.

11. The AFC circuit according to claim 10, wherein said second multiplying means includes second AND circuit means for logically operating an inverted signal of said first pulse signal output from said frequency demultiplying means, an inverted signal of said second pulse signal output from said RS flip-flop means, and said sixth pulse signal from said counter means, to produce thereby said fourth pulse signal.

12. The AFC circuit according to claim 11, wherein said frequency control means includes:
 filter means for holding said control voltage;
 first power source means for discharging said filter means;
 second power source means for charging said filter means; and
 switch means for selectively connecting said filter means to said first and second power source means in accordance with said third and fourth pulse signals output from said first and second AND circuit means, said switch means being connected to neither of said power source means when said third and fourth pulse signals are not supplied.

13. The AFC circuit according to claim 12, wherein said holding means includes:
 D flip-flop means for receiving the inverted output signal of said RS flip-flop means as data input and said sixth pulse signal output from said counter means as an inverted clock signal; and
 third AND circuit means for logically operating an output signal of said D flip-flop means and said sixth pulse signal output from said counter means, and supplying the result of the logical operation to said first and second AND circuit means, as said signal defining said predetermined period.

14. The AFC circuit according to claim 1, further comprising removal means, when said input terminal means receives a unnecessary pulse signal other than said reference pulse signal, for removing said unnecessary pulse signal.

15. The AFC circuit according to claim 14, wherein said pulse generating means includes:
 counter means, which is reset by said reference pulse signal received at said input terminal means, for counting said oscillation output pulse signal, output from said voltage controlled oscillating means, to produce thereby a fifth pulse signal at a predetermined timing; and
 RS flip-flop means, which is reset by said reference pulse signal received at said input terminal means, and set by said fifth pulse signal outputted from said counter means, for producing said second pulse signal.

16. The AFC circuit according to claim 15, wherein said counter means is reset by said reference pulse signal, and then produces said fifth pulse signal at said predetermined timing corresponding to about half of said predetermined cycle.

17. The AFC circuit according to claim 16, wherein said counter means produces a sixth pulse signal having a pulse width corresponding to about ¼ of said predetermined cycle after said counter means is reset by said reference pulse signal, and a pulse width corresponding to about ¼ of said predetermined cycle elapsing from a timing corresponding to about ¾ of said predetermined cycle after said counter means is reset by said reference pulse signal, and
 said first multiplying means includes first AND circuit means for logically operating said first pulse signal output from said frequency demultiplying means, said second pulse signal output from said RS flip-flop means, and said sixth pulse signal from said counter means, to produce thereby said third pulse signal, said sixth pulse signal being used as a signal defining said predetermined period.

18. The AFC circuit according to claim 17, wherein said second multiplying means includes second AND circuit means for logically operating an inverted signal of said first pulse signal output from said frequency demultiplying means, an inverted signal of said second pulse signal output from said RS flip-flop means, and said sixth pulse signal from said counter means, to produce thereby said fourth pulse signal.

19. The AFC circuit according to claim 18, wherein said frequency control means includes:
  filter means for holding said control voltage;
  first power source means for discharging said filter means;
  second power source means for charging said filter means; and
  switch means for selectively connecting said filter means to said first and second power source means in accordance with said third and fourth pulse signals output from said first and second AND circuit means, said switch means being connected to neither of said power source means when said third and fourth pulse signals are not supplied.

20. The AFC circuit according to claim 19, wherein said counter means produces a seventh pulse signal of a pulse width corresponding to about ¼ of said predetermined cycle elapsing from a timing corresponding to about ¾ of said predetermined cycle after said counter means is reset by said reference pulse signal, and
  said removal means includes:
  second D flip-flop means for receiving said seventh pulse signal output from said counter means as data input and said reference pulse signal received at said input terminal means as a clock signal, and producing a reset signal for resetting said counter means and said RS flip-flop means; and
  delay means for delaying said reset signal output from said second D flip-flop means and supplying the delayed signal to a reset terminal of said second D flip-flop means.

* * * * *